United States Patent

Baek et al.

[11] Patent Number: 5,843,837
[45] Date of Patent: Dec. 1, 1998

[54] METHOD OF CONTACT HOLE BURYING

[75] Inventors: Jong-Tae Baek; Youn-Tae Kim; Hyung-Joun Yoo, all of Daejeon, Rep. of Korea

[73] Assignee: Electronics and Telecommunications Research Institute, Daejeon, Rep. of Korea

[21] Appl. No.: 719,878

[22] Filed: Sep. 25, 1996

[51] Int. Cl.⁶ .............................................. H01L 21/4763
[52] U.S. Cl. ..................... 438/627; 438/628; 438/632; 438/637; 438/643; 438/644; 438/646; 438/648; 438/906
[58] Field of Search ..................... 437/190, 192, 437/194, 195, 246, DIG. 946; 148/DIG. 17, DIG. 134; 438/627, 628, 632, 637, 643, 644, 646, 648, 906

[56] References Cited

U.S. PATENT DOCUMENTS

| | | | |
|---|---|---|---|
| 4,997,518 | 3/1991 | Madokoro | 437/190 |
| 5,124,780 | 6/1992 | Sandhu et al. | 357/67 |
| 5,164,330 | 11/1992 | Davis et al. | 437/190 |
| 5,478,780 | 12/1995 | Koerner et al. | 437/190 |
| 5,521,121 | 5/1996 | Tsai et al. | 437/190 |
| 5,554,563 | 9/1996 | Chu et al. | 437/190 |

*Primary Examiner*—John Niebling
*Assistant Examiner*—Lynne A. Gurley
*Attorney, Agent, or Firm*—Antonelli, Terry, Stout & Kraus, LLP

[57] ABSTRACT

A contact hole burying method is provided including the steps of: coating an oxide layer on a substrate and removing the oxide layer except for a portion thereof to form a contact hole extending through the oxide layer in electrical contact with the oxide layer; sequentially forming a metal barrier layer and wet layer on the oxide layer and inside the contact hole to form an electrical connection to the substrate; forming a conductive metal layer on the wet layer; removing impurity ions and oxide material, which remain in the conductive metal layer which decrease mobility of metal atoms on a surface of said conductive layer due to absorption and oxidation, by a cleaning-etching process using a plasma; and reflowing the conductive metal layer at a relatively low temperature in a reactive furnace where the cleaning-etching process is performed to completely fill the contact hole.

10 Claims, 1 Drawing Sheet

METHOD OF CONTACT HOLE BURYING

BACKGROUND OF THE INVENTION

1. Field of the Invention

The present invention relates to a method for burying a completely filling hole, and more particularly, to a method for completely filling a contact hole or via hole having a very small size and high aspect ratio by filling it with wiring metal to prevent a void.

2. Description of the Prior Art

Recently, as the semiconductor device becomes highly integrated, the size of each device is getting smaller. Therefore, the width of wiring is getting narrower, and the size of the contact hole filled with the wiring metal to connect the wires of the semiconductor layer or other layers is also getting smaller. Moreover, because the aspect ratio of contact holes is getting higher, the process to fill contact holes with wiring metal gets more complicated and difficult. For example, if the wiring metal is buried in a small contact hole having a high aspect ratio, using a simple depositing technique, the conductive metal does not completely fill the contact hole. Instead a void is formed in the contact hole.

This kind of void deteriorates the connection between the semiconductor and wiring, or between other wires. As a result, the reliability of the element is decreased and the entire circuit must be discarded.

Therefore, there has been a search for a technique for filling the contact hole having a high aspect ratio and a ultra-minute contact window such as a via hole, with a conductive metal, in manufacturing a semiconductor device. Recently various studies on the topic have been actively progressed.

For a conventional method for burying the above-mentioned contact hole, there are two methods: a high-temperature sputtering method; and a method for preventing voids by reflowing at a high temperature after the sputtering process.

The high-temperature sputtering method is that a substrate is heated above 550° C. and then sputtered. The other method is performed in a manner that a substrate in a chamber is sputtered at a low temperature, and the coated substrate out side of the chamber is installed in a reflow furnace to be heat-treated at a temperature above 550° C. Both methods allow the deposited conductive metal to freely flow by enhancing the characteristic of migration of aluminum, thereby burying the contact hole and forming the wire.

However, in the conventional contact hole burying method, during the heat-treatment above 550° C., even though the metal barrier layer is formed on the substrate, the deposited aluminum reacts with the semiconductor device and thus generates spikes on the PN adjoining surface.

Specifically, in the high-temperature sputtering method, because an island is extended centering on a core generated during the deposition, the conductive metal is not uniformly deposited and thus the wire is often cut down.

Additionally, in the sputtering-reflowing method, in the case of transporting the substrate, after aluminum is deposited from the chamber to the reflowing device, the surface of the deposited aluminum layer becomes oxidized or impurity ions may stick to the surface, and thus the mobility of the aluminum is decreased. As a result, the contact hole cannot be completely buried.

SUMMARY OF THE INVENTION

An object of the invention is to solve the problems of prior art, and to provide a method for burying a contact hole capable of decreasing the generation of spikes on PN adjoining surfaces, preventing a wire from being cut down due to the previously formed island, preventing the surface of a deposited aluminum layer from being oxidized, and preventing the mobility characteristic of the aluminum from being decreased due to pollution.

To achieve the object, the invention includes the steps of: coating an oxide layer on a substrate and removing the oxide layer excluding a predetermined portion of the coated substrate to form a contact hole; sequentially forming a metal barrier layer and wet layer on the oxide layer and inside the contact hole to electrically connect to the substrate; forming a conductive metal layer on the wet layer; removing impurity ions and oxide material, which remain in the conductive metal layer and thus decreasing a mobility of metal atoms on the surface due to absorption and oxidation, by the cleaning-etching process using a plasma; and reflowing the conductive metal layer at a relatively low temperature in a reactive furnace where the cleaning-etching process is performed, thereby burying the contact hole.

BRIEF DESCRIPTION OF THE ATTACHED DRAWINGS

FIGS. 1A to 1C illustrate the burying procedures of the contact hole burying method according to one embodiment of the invention.

DETAILED DESCRIPTION OF PREFERRED EMBODIMENT

A preferred embodiment of a contact hole burying method of the invention will be described with reference to the attached drawings in detail.

Figure 1A:
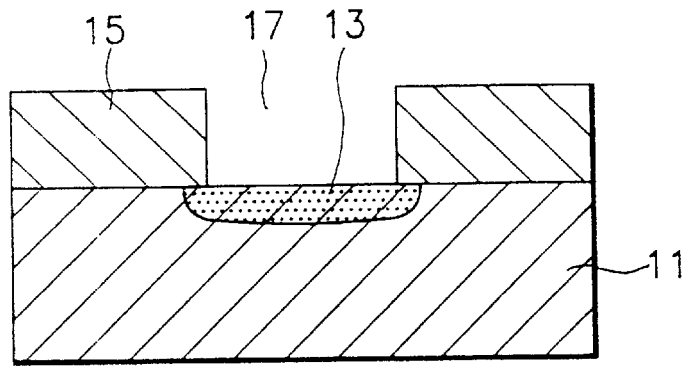

With reference to FIG. 1A, an oxide layer 15 is formed on an N-type substrate 11 where a heavily doped P-type diffusion area 13 is formed. By using a photo-lithography, a predetermined area of the oxide layer 15 is removed excluding the diffusion area 13 to form a contact hole 17 on the substrate 11.

Here, the substrate 11 is a semiconductor substrate, or a wire which does not need the above diffusion area 13.

Figure 1B:
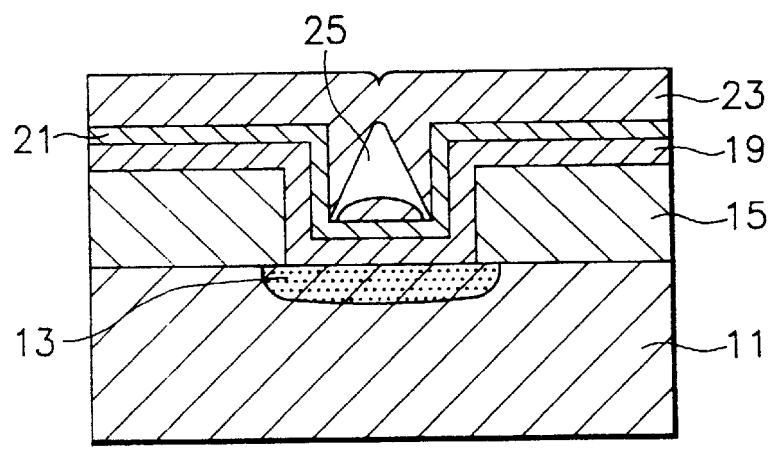

Now turning to FIG. 1B, a metal barrier layer 19 as thick as 500 to 1500 Å and a wet layer 21 as thick as 200 to 700 Å are sequentially formed on the oxide layer 15, using a sputtering method.

Here, the metal barrier layer 19 is formed of Tin, TiW, Al—Si—Cu, $TiSi_2$ and $WSi_2$, and the wet layer 21 is formed of Al, Cu, W, Ti, Ta and Mo.

The metal barrier layer 19 and wet layer 21 are formed on the inner surface of the contact hole 17 to make contact with the diffusion area 13.

Ions such as Al, Cu, W, Ti, Ta and Mo are deposited on the wet layer 21 to a thickness of 1500 to 3000 Å to form a conductive metal layer 23, using CVD method.

In the above process, in the conductive metal layer 23, the entrance of the contact hole 17 is first deposited, because of the characteristic of the CVD method. Therefore, the inside of the contact hole 17 is not completely buried, and thus a void 25 is formed inside the conductive metal layer 23.

Figure 1C:
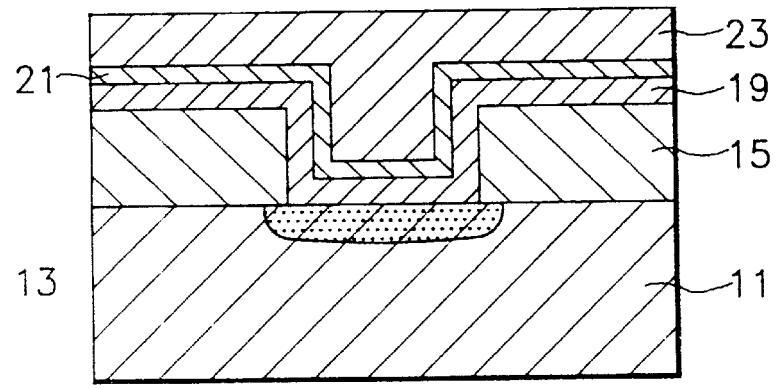

With reference to FIG. 1C, to remove impurity ions and oxidation material absorbed and oxidized on the surface of the conductive metal layer 23 and decreasing the mobility characteristic of the metal atoms on the surface, the surface of the conductive layer 23 is cleaned and etched to a thickness of 30 to 100 Å in the reflow reaction furnace having a plasma module.

The above-mentioned cleaning-etching step is performed in a manner that the pressure of the reaction furnace is increased to several torrs. Then the RF sputtering etching step is performed, using plasma generated by implanting inert gases such as Ar and He as a reactive gas and applying a voltage. Here, during the cleaning-etching process, an oxidation removing gas such as $Cl_2$, $SiCl_4$, $BCl_3$, and $CHF_3$ may be mixed with the reactive gas.

At this time, to completely remove the impurity ions, while minimizing the damage of the surface of the conductive metal layer 23, the plasma source should increase its ionization rate to have a high density plasma. The plasma source also should decrease the plasma potential to minimize the generation of the polluting material in the reaction furnace, and maintain ion energy incident on the substrate 11 in a range of 100 to 150 eV. Therefore, TCP, ICP, RIE, ECR, Helicon and MORI are used for the plasma source.

Thereafter, the contact hole 17 is buried by reflowing the conductive metal layer 23 at a temperature of 300° to 500° C. in the reaction furnace which performs the cleaning-etching process. Here, as the impurity ion and oxidation material are removed from the surface of the conductive metal layer 23 to enhance the mobility characteristic of the conductive metal, the contact hole 17 can be buried by filling the void 25 at a relatively low temperature. Here, during the reflowing process, the wet layer 21 helps the conductive metal flow.

The conductive metal layer 23 can be reflown in the plasma state where the surface of the conductive metal layer is cleaned and etched.

As the reactive ions for the plasma and radical mobility energy are applied to the surface of the conductive metal layer 23 the driving force of the metal atom increases and the mobility characteristic can be remarkably enhanced even though the reflowing is performed at a uniform temperature.

As described above, in the invention, the oxide layer is coated on the substrate; the oxide layer is removed excluding a predetermined portion of the coated substrate to form the contact hole; the metal barrier layer and wet layer are sequentially formed on the oxide layer and inside the contact hole; a conductive metal layer is formed on the wet layer, using the CVD method; the surface of the conductive metal layer is cleaned and etched at the plasma stage to remove impurity ions and oxide material on the conductive metal layer; and the conductive metal layer is reflown at a temperature of 300° to 500° C. in the reactive furnace where the cleaning and etching process is performed to fill the void, thereby burying the contact hole.

The contact hole burying method of the thus-structured invention enhances the mobility characteristic of the metal atoms on the conductive metal layer, and thus reflow at a low temperature. Therefore, the invention has an advantage of decreasing spikes on the PN adjoining surface.

Additionally, the contact hole burying method of the invention has another advantage that prevents the wire from being cut down due to the generation of an island, using the enhanced mobility characteristic of the atoms on the surface of the conductive metal layer.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A method for completely filling a contact hole comprising the steps of:

coating an oxide layer on a substrate and removing said oxide layer except for a portion thereof to form said contact hole extending through said oxide layer in electrical contact with said substrate;

sequentially forming a metal barrier layer and a wet layer on said oxide layer and inside said contact hole to form an electrical connection with said substrate;

forming a conductive metal layer on said wet layer;

removing impurity ions and oxide material, which remain in said conductive metal layer and decrease mobility of metal atoms on a surface of said conductive metal layer due to absorption and oxidation, by a cleaning-etching process using a plasma in a reflow reaction furnace; and reflowing said conductive metal layer at a relatively low temperature between 300° to 500° C. in said reflow reaction furnace where the cleaning-etching process is performed in the plasma state where said surface of said conductive metal layer is cleaned and etched to completely fill said contact hole, wherein the surface of said conductive metal layer is cleaned and etched by maintaining said reflow reactive furnace having a plasma module at several torrs of pressure and generating a plasma.

2. The method as claimed in claim 1, wherein said substrate is one of a first conductivity type semiconductor material or a wire, said substrate having a diffusion area which is doped heavily with a second conductivity type of impurity ions.

3. The method as claimed in claim 1, wherein said metal barrier layer is formed using one of TiN, TiW, $TiSi_2$ and $WSi_2$ having a thickness of 500 to 1500 Å, using a sputtering method.

4. The method as claimed in claim 1, wherein said wet layer is formed using one of Al, Cu, W, Ti, Ta and Mo having a thickness of 200 to 700 Å, using a sputtering method.

5. The method as claimed in claim 1, wherein said conductive metal layer is formed using one of Al, Cu, W, Ti, Ta and Mo having a thickness of 1500 to 3000 Å using a CVD method.

6. The method as claimed in claim 1, wherein inert gas including Ar or He is used for a reactive gas in said cleaning-etching process.

7. The method as claimed in claim 1, wherein a mixture of said inert gas including Ar or He, and an oxide material removing gas such as $Cl_2$, $SiCl_4$, $BCl_3$ and $CHF_3$, is said reactive gas in said cleaning-etching step.

8. The method as claimed in claim 6, wherein the surface of said conductive metal layer is cleaned and etched having a thickness of 30 to 100 Å.

9. The method as claimed in claim 7, wherein the surface of said conductive metal layer is cleaned and etched having a thickness of 30 to 100 Å.

10. The method as claimed in claim 1, wherein one of TCP, ICP, RIE, MERIE, ECR, Helicon and MORI is used for a plasma source generating said plasma.

* * * * *